United States Patent
Gehring et al.

(10) Patent No.: US 7,772,077 B2
(45) Date of Patent: Aug. 10, 2010

(54) METHOD OF FORMING A SEMICONDUCTOR STRUCTURE COMPRISING A FIELD EFFECT TRANSISTOR HAVING A STRESSED CHANNEL REGION

(75) Inventors: Andreas Gehring, Dresden (DE); Andy Wei, Dresden (DE); Anthony Mowry, Dresden (DE); Manuj Rathor, Milpitas, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 437 days.

(21) Appl. No.: 11/750,816

(22) Filed: May 18, 2007

(65) Prior Publication Data

US 2008/0102590 A1 May 1, 2008

(30) Foreign Application Priority Data

Oct. 31, 2006 (DE) .................. 10 2006 051 494

(51) Int. Cl.
*H01L 21/336* (2006.01)
(52) U.S. Cl. .................. 438/308; 257/E21.324; 257/E21.618
(58) Field of Classification Search .............. 438/308; 257/E21.324, E21.618
See application file for complete search history.

(56) References Cited

U.S. PATENT DOCUMENTS

| 6,689,671 B1 | 2/2004 | Yu et al. ............... 438/486 |
| 7,307,273 B2 * | 12/2007 | Currie ............... 257/18 |
| 7,316,960 B2 * | 1/2008 | Ting ............... 438/308 |
| 7,479,465 B2 * | 1/2009 | Spencer et al. ............... 438/308 |
| 2002/0160553 A1 | 10/2002 | Yamanaka et al. ............... 438/149 |
| 2005/0023577 A1 * | 2/2005 | Ito ............... 438/308 |
| 2005/0199958 A1 | 9/2005 | Chen et al. ............... 257/368 |
| 2006/0017138 A1 | 1/2006 | Ting ............... 257/632 |
| 2006/0094194 A1 | 5/2006 | Chen et al. ............... 438/301 |
| 2006/0099745 A1 | 5/2006 | Hsu et al. ............... 438/149 |
| 2006/0228847 A1 | 10/2006 | Liu et al. ............... 438/199 |
| 2006/0234455 A1 | 10/2006 | Chen et al. ............... 438/276 |
| 2007/0010073 A1 * | 1/2007 | Chen et al. ............... 438/486 |
| 2008/0124858 A1 * | 5/2008 | Nguyen et al. ............... 438/217 |
| 2008/0220574 A1 * | 9/2008 | Jeng et al. ............... 438/231 |

OTHER PUBLICATIONS

German Office Action dated Aug. 2, 2007 for serial No. 10 2006 051 494.7-33.

* cited by examiner

*Primary Examiner*—W. David Coleman
*Assistant Examiner*—Sun M Kim
(74) *Attorney, Agent, or Firm*—Williams, Morgan & Amerson, P.C.

(57) ABSTRACT

A method of forming a semiconductor structure comprises providing a semiconductor substrate comprising a first transistor element and a second transistor element. The first transistor element comprises at least one first amorphous region and the second transistor element comprises at least one second amorphous region. A stress-creating layer is formed over the first transistor element. The stress-creating layer does not cover the second transistor element. A first annealing process is performed. The first annealing process is adapted to re-crystallize the first amorphous region and the second amorphous region. After the first annealing process, a second annealing process is performed. The stress-creating layer remains on the semiconductor substrate during the second annealing process.

9 Claims, 4 Drawing Sheets

METHOD OF FORMING A SEMICONDUCTOR STRUCTURE COMPRISING A FIELD EFFECT TRANSISTOR HAVING A STRESSED CHANNEL REGION

BACKGROUND OF THE INVENTION

1. Field of the Invention

The present disclosure generally relates to the formation of integrated circuits, and, more particularly, to the formation of semiconductor structures comprising field effect transistors having stressed channel regions.

2. Description of the Related Art

Integrated circuits comprise a large number of individual circuit elements, e.g., transistors, capacitors and resistors. These elements are connected internally to form complex circuits, such as memory devices, logic devices and microprocessors. The performance of integrated circuits can be improved by increasing the number of functional elements per circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They provide a means to control a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and on the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive stress. This leads to a modified mobility of electrons and holes, respectively. Depending on the magnitude of the stress, a compressive stress may significantly increase the mobility of holes in a silicon layer. The mobility of electrons may be increased by providing a silicon layer having a tensile stress.

Figure 1A:
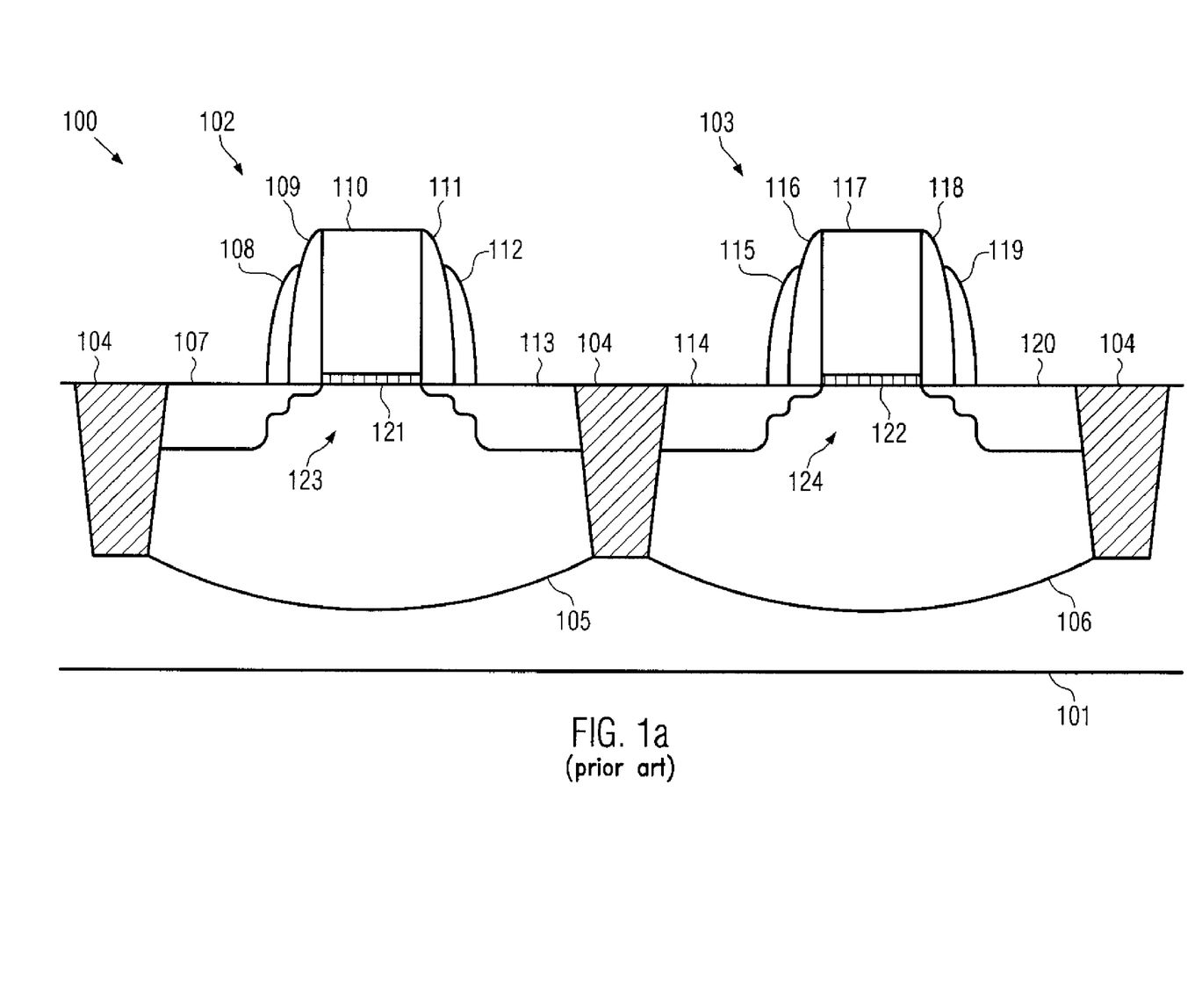
FIGS. 1a-1b show schematic cross-sectional views of a semiconductor structure in stages of a method according to the state of the art.

A method of forming a field effect transistor wherein the channel region is formed in stressed silicon will be described in the following with reference to FIGS. 1a-1b. FIG. 1a shows a schematic cross-sectional view of a semiconductor structure 100 in a first stage of a manufacturing process according to the state of the art.

The semiconductor structure 100 comprises a substrate 101. The substrate 101 comprises a first transistor element 102 and a second transistor element 103. The first transistor element 102 comprises an active region 105 formed in the substrate 101. A gate electrode 110 is formed over a channel region 123 in the substrate 101 and separated therefrom by a gate insulation layer 121. The gate electrode 110 is flanked by inner sidewall spacers 109, 111 and outer sidewall spacers 108, 112. In the substrate 101, a source region 107 and a drain region 113 are formed adjacent the gate electrode 101.

Similarly, the second transistor element 103 comprises an active region 106, a gate electrode 117, a gate insulation layer 122, inner sidewall spacers 116, 118, outer sidewall spacers 115, 119, a source region 114, a drain region 120 and a channel region 124. A trench isolation structure 104 provides electrical insulation between the first transistor element 102 and the second transistor element 103. Additionally, the trench isolation structure 104 may provide electrical insulation between the transistor elements 102, 103 and other electrical elements in the semiconductor structure 100.

The first transistor element 102 and the second transistor element 103, as well as the trench isolation structure 104, may be formed by means of well-known methods of photo-lithography, etching, deposition, ion implantation and oxidation. In particular, the active regions 105, 106, the source regions 107, 114 and the drain regions 113, 120 may be formed by implanting ions of dopant materials into the semiconductor structure 100.

In some examples of methods of forming a semiconductor structure according to the state of the art, the first transistor element 102 can be an N-type transistor and the second transistor element 103 can be a P-type transistor. In such methods, the active region 105 may comprise a P-type dopant and the active region 106 may comprise an N-type dopant. The source region 107 and the drain region 113 comprise an N-type dopant. The source region 114 and the drain region 120 comprise a P-type dopant. In ion implantation processes, one of the field effect transistor elements 102, 103 may be covered with a mask which may, for example, comprise a photoresist, while the other of the field effect transistor elements 102, 103 is irradiated with ions. Thus, an undesirable introduction of dopants which are not in line with the type of the transistor elements 102, 103 may be avoided.

In the formation of the source regions 107, 114 and the drain regions 113, 120, a plurality of implantation processes may be performed for each of the transistor elements 102, 103. First, ion implantation processes may be formed before the formation of the inner sidewall spacers 109, 111, 116, 118 and the outer sidewall spacers 108, 112, 115, 119. Thereafter, the inner sidewall spacers 109, 111, 116, 118 can be formed by means of known methods comprising an isotropic deposition of a material layer and an anisotropic etching process.

After the formation of the inner sidewall spacers 109, 111, 116, 118, second ion implantation processes can be performed. In the second ion implantation processes, the inner sidewall spacers 109, 111, 116, 118 absorb ions impinging in the vicinity of the gate electrodes 110, 117. Hence, in the second ion implantation process, substantially no dopants are introduced in the vicinity of the gate electrodes 110, 117. Thus, dopants may be selectively introduced into portions of the source regions 107, 114 and the drain regions 113, 120 having a distance from the gate electrodes 110, 117 which is greater than a thickness of the inner sidewall spacers 109, 111, 116, 118.

Thereafter, the outer sidewall spacers 108, 112, 115, 119 are formed and third ion implantation processes are performed. In the third ion implantation processes, both the inner sidewall spacers 109, 111, 116, 118 and the outer sidewall spacers 108, 112, 115, 119 absorb ions impinging on the semiconductor structure 100. Thus, dopants may be selectively introduced into portions of the source regions 107, 114 and the drain regions 113, 120 having a distance from the gate electrodes 110, 117 which is greater than a sum of the thickness of the inner sidewall spacers 109, 111, 116, 118 and a thickness of the outer sidewall spacers 108, 112, 115, 119.

Hence, dopant profiles in the source regions 107, 113 and the drain regions 114, 120 may be controlled by varying a thickness of the inner sidewall spacers 109, 111, 116, 118, a thickness of the outer sidewall spacers 108, 112, 115, 119 and ion doses applied in the first, second and third ion implantation processes. Thus, highly sophisticated dopant profiles may be created in the first transistor element 102 and the second transistor element 103.

In the ion implantation processes performed in the formation of the source regions 107, 114 and the drain regions 113, 120, atoms of the substrate 101 may be pushed away from their sites in the crystal lattice of the material of the substrate 101. In modern methods of manufacturing a semiconductor structure, ion doses applied in the formation of the source regions 107, 114 and the drain regions 113, 120 may be sufficient to destroy the crystalline order of the material of the substrate 101, such that an amorphous material is obtained in the source regions 107, 114 and the drain regions 113, 120.

Figure 1B:
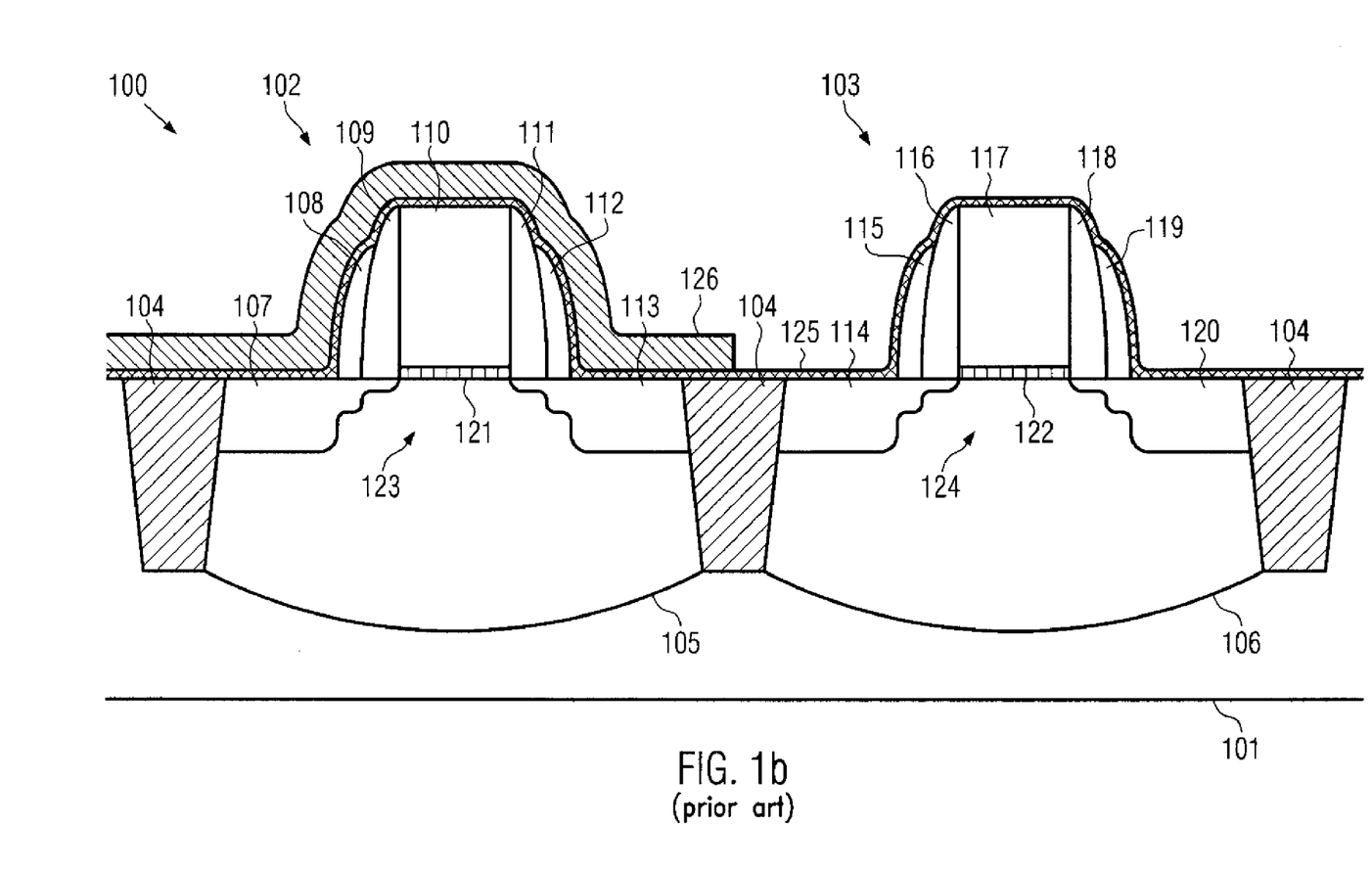

FIG. 1b shows a schematic cross-sectional view of the semiconductor structure 100 in a later stage of the manufacturing process according to the state of the art. A liner layer 125 and a stress-creating layer 126 are formed over the first transistor element 102 and the second transistor element 103. The stress-creating layer 126 may comprise a relatively hard material such as silicon nitride and the liner layer 125 may comprise silicon dioxide. In the formation of the liner layer 125 and the stress-creating layer 126, methods of deposition well known to persons skilled in the art, such as chemical vapor deposition and/or plasma enhanced chemical vapor deposition, may be employed.

A portion of the stress-creating layer 126 covering the second transistor element 103 may be removed. To this end, a mask comprising a photoresist covering the first transistor element 102 may be formed. Thereafter, an etching process adapted to selectively remove the material of the stress-creating layer 126 can be performed. An etchant used in the etching process may be adapted such that the liner layer 125 is substantially not affected by the etching process. Thus, the etching process may be stopped as soon as the stress-creating layer 126 is removed. Portions of the stress-creating layer 126 over the first transistor element 102 are protected from being etched by the mask and remain on the surface of the semiconductor structure 100. After the etching process, the mask can be removed by means of a known resist strip process.

An annealing process is performed. In the annealing process, the semiconductor structure 100 is exposed to an elevated temperature for a predetermined time. In the annealing process, amorphous material in the source regions 107, 114 and the drain regions 113, 120 re-crystallizes. In the re-crystallization process, atoms in the source regions 107, 114 and the drain regions 113, 120 adapt to the crystalline order of portions of the substrate 101 below the source regions 107, 114 and the drain regions 113, 120. Thus, a crystalline material may be obtained in the source regions 107, 114 and the drain regions 113, 120.

Amorphous semiconductor materials may have a lower density than crystalline semiconductor material. In particular, a density of amorphous silicon is lower than a density of crystalline silicon. Therefore, the material of the source regions 107, 114 and the drain regions 113, 120 tends to reduce its volume in the re-crystallization process.

In the first transistor element 102, the stress-creating layer 126, which, as detailed above, may comprise a relatively hard material such as silicon nitride, may prevent a reduction of the volume of the material in the source region 107 and the drain region 113, since the material of the source region 107 and the drain region 113 adheres to the stress-creating layer 126, and the hardness of the stress-creating layer 126 may prevent a deformation of the stress-creating layer 126.

Therefore, the atoms in the source region 107 and the drain region 113 may arrange at a distance which is greater than the bulk lattice constant of the material of the substrate 101. Thus, an intrinsic tensile stress can be created in the source region 107, the drain region 113 and in a channel region 121 of the first transistor element 102.

In the second transistor element 103, the volume of the material of the source region 114 and the drain region 120 may change during the annealing process. Hence, the source region 114, the drain regions 120, as well as a channel region 122 of the second transistor element 103, may be substantially unstressed.

The annealing process may also be employed in order to activate the dopant materials in the source regions 107, 114 and the drain regions 113, 120 such that they may act as electron donors or acceptors.

After the annealing process, the stress-creating layer 126 and the liner layer 125 may be removed by means of an etching process. The intrinsic stress in the source region 107, the drain region 113 and the channel region 123 of the first transistor element 102, however, may be maintained after the removal of the stress-creating layer 126. This phenomenon is known to persons skilled in the art as "stress memorization."

A problem of the above method of forming a semiconductor structure is that, in the annealing process, dopant materials in the source regions 107, 114 and the drain regions 113, 120 may diffuse. Hence, sophisticated dopant profiles created by means of the first to third ion implantation process may be blurred.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment disclosed herein, a method of forming a semiconductor structure comprises providing a semiconductor substrate comprising a first transistor element and a second transistor element. The first transistor element comprises at least one first amorphous region and the second transistor element comprises at least one second amorphous region. A stress-creating layer is formed over the first transistor element. The stress-creating layer does not cover the second transistor element. A first annealing process is performed. The first annealing process is adapted to re-crystallize the first amorphous region and the second amorphous region. After the first annealing process, a second annealing process is performed. The stress-creating layer remains on the semiconductor substrate during the second annealing process.

According to another illustrative embodiment disclosed herein, a method of forming a semiconductor structure comprises providing a semiconductor substrate comprising a first transistor element and a second transistor element. A stress-creating layer is formed over the first transistor element. The stress-creating layer does not cover the second transistor element. An annealing process is performed. The annealing process comprises irradiating the semiconductor substrate with laser radiation. The stress-creating layer remains on the semiconductor substrate during the annealing process.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In some embodiments, a stress-creating layer is formed over a first transistor element provided in a semiconductor substrate. A second transistor element provided in the semiconductor substrate is not covered by the layer of the material. A first and a second annealing process are performed, wherein the layer of the material remains on the semiconductor substrate during both annealing processes.

While the first annealing process can be adapted to induce a solid phase epitaxial re-growth of amorphous regions in the first and the second transistor element, the second annealing process can be adapted to activate dopant materials in the transistor element. In some embodiments, the second annealing process can comprise irradiating the semiconductor substrate with laser radiation. Thus, portions of the semiconductor substrate in the vicinity of a substrate thereof may be exposed to relatively high temperatures for a relatively short time. Hence, dopants may be activated, while the short duration of the second annealing process may substantially prevent or at least reduce a diffusion of dopant atoms. The presence of the layer of the material on the semiconductor substrate during the second annealing process reduces a relaxation of an intrinsic stress in a channel region of the first transistor element during the second annealing process.

Figure 2A:
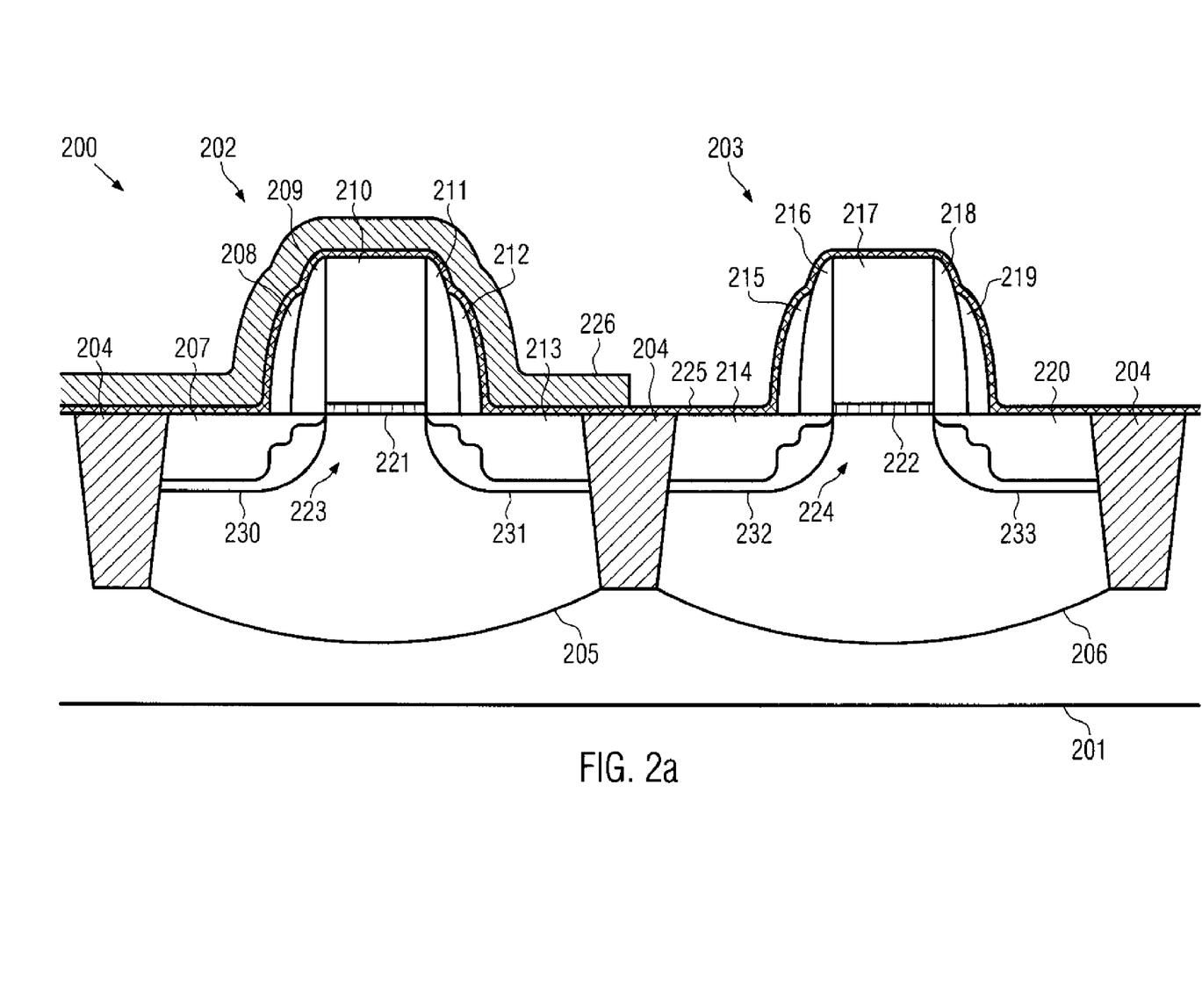
FIGS. 2a-2b show schematic cross-sectional views of a semiconductor structure in stages of a method according to illustrative embodiments disclosed herein.

FIG. 2a shows a schematic cross-sectional view of a semiconductor structure 200 in a first stage of a manufacturing process according to an illustrative embodiment disclosed herein. The semiconductor structure 200 comprises a substrate 201. The substrate 201 may comprise a semiconductor material, for example, silicon. While, in some embodiments of the present invention, the substrate 201 can be a bulk silicon substrate, in other embodiments, the substrate 201 can be a silicon-on-insulator (SOI) substrate.

In and on the substrate 201, a first transistor element 202 and a second transistor element 203 are formed. A trench isolation structure 204 electrically isolates the first transistor element 202 and the second transistor element 203 from each other and from other circuit elements in the semiconductor structure 200.

The first transistor element 202 comprises an active region 205 and a gate electrode 210. A gate insulation layer 221 separates the gate electrode 210 from a channel region 223 located in the substrate 201 below the gate electrode 210. The gate electrode 210 is flanked by inner sidewall spacers 209, 211 and outer sidewall spacers 208, 212. In the substrate 201, a source region 207 and a drain region 213 are formed adjacent the gate electrode 210.

Similar to the first transistor element 202, the second transistor element 203 comprises an active region 206, a gate electrode 217, a gate insulation layer 222, a channel region 224, inner sidewall spacers 216, 218, outer sidewall spacers 215, 219, a source region 214 and a drain region 220.

The first transistor element 202 and the second transistor element 203 can be formed by means of known methods of photolithography, etching, deposition, oxidation and ion implantation. In particular, advanced known methods of ion implantation may be employed in order to provide highly sophisticated dopant profiles in the source regions 207, 214 and the drain regions 213, 220, similar to those employed in the method of manufacturing a semiconductor structure according to the state of the art described above with reference to FIGS. 1a-1b. In some embodiments, the first transistor element 202 can be an N-type transistor and the second transistor element 203 can be a P-type transistor. In other embodiments, the first transistor element 202 can be a P-type transistor and the second transistor element 203 can be an N-type transistor.

The first transistor element 202 may further comprise a source-side amorphous region 230 and a drain-side amorphous region 231. Similarly, the second transistor element 203 may comprise a source-side amorphous region 232 and a drain-side amorphous region 233. In some embodiments, the amorphous regions 230, 231, 232, 233 may be formed prior to the formation of the source regions 207, 214 and the drain regions 213, 220.

To this end, the substrate 201 can be irradiated with an ion beam (not shown). The ion beam comprises ions of a non-doping element which do not contribute to the number of charge carriers in the substrate 201 material when they are incorporated into its crystal lattice. The non-doping element can be a noble gas, such as argon (Ar), xenon (Xe) or krypton (Kr). Typical implant energies and doses for the above-identified non-doping elements are in the range of approximately 30-600 keV and approximately $5 \times 10^{14}$-$10^{17}$ ions/cm$^2$.

In other embodiments, the non-doping element can be an element of the fourth group of the periodic table of elements, e.g., silicon (Si) or germanium (Ge), which are iso-electronic to a silicon substrate. The ions push atoms in the substrate 201 away from their sites in the crystal lattice. Ion energy and ion flux of the ion beam and the time of exposure of the substrate 201 to the ion beam are adapted such that the long range order, and mostly the short range order, of the crystal lattice is lost and the material becomes amorphous.

In other embodiments, the amorphous regions 230, 231, 232, 233 may be formed during the formation of the source regions 207, 214 and the drain regions 213, 220. In such embodiments, implant energies and doses applied in the formation of the source regions 207, 214 and the drain regions 213, 220 may be adapted such that the long range order, and mostly the short range order, of the material of the substrate 201 in the source regions 207, 214 and the drain regions 213, 220 is lost and amorphous material is obtained.

Amorphous materials may have a lower density than crystalline materials. For example, amorphous silicon may have a lower density than crystalline silicon. Hence, a volume of the portions of the semiconductor substrate 201 in which the amorphous regions 230, 231, 232, 233 are formed may increase during the amorphization process.

A liner layer 225 and a stress-creating layer 226 are formed over the substrate 201. In some embodiments, the liner layer 225 may comprise silicon dioxide and the stress-creating layer 226 may comprise silicon nitride. In other embodiments, the liner layer 225 may comprise silicon nitride and the stress-creating layer 226 may comprise silicon dioxide. In still further embodiments, at least one of the liner layer 225 and the stress-creating layer 226 may comprise silicon oxynitride. While, in some embodiments, the stress-creating layer 226 may be substantially unstressed, in other embodiments, the stress-creating layer 226 may comprise a tensile or compressive intrinsic stress.

Both the liner layer 225 and the stress-creating layer 226 can be formed by means of plasma enhanced chemical vapor deposition. As persons skilled in the art know, in plasma enhanced chemical vapor deposition, the semiconductor structure 200 is provided in a reactor vessel. A reactant gas is supplied to the reactor vessel. The reactant gas comprises chemical compounds which may react chemically with each other. In the chemical reaction, the material to be deposited is created. A radio-frequency alternating voltage and, optionally, a DC or low-frequency AC bias voltage, may be applied between a first electrode provided in the reactor vessel and the semiconductor structure 200 or a second electrode located in the vicinity of the semiconductor structure 200. The radio-frequency alternating voltage and the bias voltage create a glow discharge in the reactant gas. In the glow discharge, reactive species, such as ions, atoms or radicals, are generated from the reactant gas. Thus, relatively high reaction rates may be obtained at moderate temperatures, which may help reduce the thermal budget of the semiconductor structure 200.

Properties of the stress-creating layer 226, in particular an intrinsic stress thereof, may be controlled by varying parameters of the plasma enhanced chemical vapor deposition process, such as temperature and pressure of the reactant gas, as well as power and frequency of the radio-frequency alternating voltage and the bias voltage. Parameter values which allow obtaining a stress-creating layer 226 having substantially no intrinsic stress or a stress-creating layer having a tensile or compressive intrinsic stress are known to persons skilled in the art or may be determined by means of routine experimentation.

A portion of the stress-creating layer 226 over the second transistor element 203 is removed. To this end, a mask (not shown) comprising a photoresist may be formed over the first transistor element 202 by means of well-known methods of photolithography. Thereafter, an etching process, for example a dry etching process, may be performed. An etchant used in the etching process may be adapted to etch the material of the stress-creating layer 226, leaving the material of the liner layer 225 substantially intact. Hence, the liner layer 225 may act as an etch stop layer, protecting the second transistor element 203 from being affected by the etchant. The mask may be removed after the etching process. After the etching process, the stress-creating layer 226 covers the first transistor element 202, but not the second transistor element 203.

A first annealing process may be performed. The first annealing process may be adapted to induce a re-crystallization of the material in the amorphous regions 230, 231, 232, 233. In some embodiments, the first annealing process may be a rapid thermal annealing process. In rapid thermal annealing, the semiconductor structure 200 is exposed to an elevated temperature for a relatively short time. In some embodiments, the rapid thermal annealing process may have a duration of about 30 seconds or less. In some embodiments, the rapid thermal annealing process may have a duration of about 1 second or less. As persons skilled in the art know, rapid thermal annealing processes wherein the semiconductor structure 200 is exposed to the elevated temperature for less than about 1 second are sometimes denoted as "spike annealing." Rapid thermal annealing may be performed by irradiating the semiconductor structure 200 with electromagnetic radiation which may, for example, comprise light generated by means of one or more lamps.

In other embodiments, the first annealing process may comprise introducing the semiconductor structure 200 into an oven heated to an elevated temperature. A temperature to which the semiconductor structure 200 is heated in the annealing process can be adapted such that a re-crystallization of the material of the amorphous regions 230, 231, 232, 233 occurs. The temperature applied in the first annealing process may be adapted to induce solid phase epitaxial re-growth of the material in the amorphous regions 230, 231, 232, 233, wherein the material of the amorphous regions 230, 231, 232, 233 passes into the crystalline state without there being an intermediary liquid phase. In embodiments wherein the substrate 201 comprises silicon, the first annealing process may be performed at a temperature of about 500° C. or more.

The re-crystallization of the material in the amorphous regions 230, 231, 232, 233 may occur at temperatures which are lower than a temperature required in order to activate dopants introduced into the source regions 207, 214, and the drain regions 213, 220. For example, in embodiments wherein the substrate 201 comprises silicon, a full activation of dopants may occur at temperatures of about 800-1000° C. or more, while solid phase epitaxial re-growth may occur at temperatures of about 500° C. or more. In some embodiments, the first annealing process may be performed at a temperature less than about 800° C., at a temperature less than about 700° C. or at a temperature less than about 600° C. More specifically, the first annealing process may be performed at a temperature in a range from about 500-800° C., at a temperature in a range from about 500-700° C. or at a temperature in a range from about 500-600° C. Advantageously, performing the first annealing process at a relatively low temperature may help reduce a diffusion of dopant atoms in the source regions 207, 214 and in the drain regions 213, 220. Hence, dopant profiles created in the source regions 207, 214 and in the drain regions 213, 220 by means of ion implantation may be substantially maintained.

In other embodiments, the first annealing process may be performed at a temperature at which an activation of dopants in the source regions 207, 214 and in the drain regions 213, 220 may occur.

In the fist annealing process, a density of the material in the amorphous regions 230, 231 232, 233 may increase. In the second transistor element 203, the material in the amorphous regions 232, 233 may, without restraint, substantially shrink in the re-crystallization process. Hence, the material in the amorphous regions 232, 233 may remain substantially unstressed.

In the first transistor element 202, the presence of the stress-creating layer 226 may have an influence on the shrinkage of the material in the amorphous region 230, 231. In particular, similar to the method of forming a semiconductor structure described above with reference to FIGS. 1a-1b, the stress-creating layer 226 may prevent or reduce a reduction of the volume of the material in the amorphous regions 230, 231, since the material of the amorphous regions 230, 231 adheres to the stress-creating layer 226, and a stiffness of the stress-creating layer 226 may prevent or reduce a deformation of the stress-creating layer 226.

Hence, atoms of the material of the substrate 201 may arrange at a distance which is greater than the lattice constant of the material of the substrate 201 in a bulk crystal. Thus, an intrinsic tensile stress may be created in the source region 207 and the drain region 213. The intrinsic tensile stress of the source region 207 and the drain region 213 may have an influence on portions of the substrate 201 in the vicinity of the source region 207 and the drain region 213, in particular on the channel region 223. Thus, a tensile stress may be created in the channel region 223. The tensile stress may be employed to increase the mobility of electrons in the channel region 223. This can help to improve the performance of the first transistor element 202, in particular in embodiments wherein the first transistor element 202 is an N-type transistor.

The intrinsic stress created in the source region 207 and the drain region 213, as well as the stress created in the channel region 223 of the first transistor element 202, may be influenced by an intrinsic stress of the stress-creating layer 226. As detailed above, an intrinsic tensile or compressive stress of the stress-creating layer 226 may be controlled by varying parameters of a deposition process employed in the formation of the stress-creating layer 226. While a tensile stress of the stress-creating layer 226 may enhance the tensile stress created in the source region 207, the drain region 213 and the channel region 223, a compressive stress of the stress-creating layer 226 can reduce the tensile stress created in the source region 207, the drain region 213 and the channel region 223 or may even lead to a formation of a compressive stress in these regions. A compressive stress in the channel region 223 may enhance the mobility of holes. This may help to improve the performance of the first transistor element 202, in particular in embodiments wherein the first transistor element 202 comprises a P-type transistor.

Figure 2B:
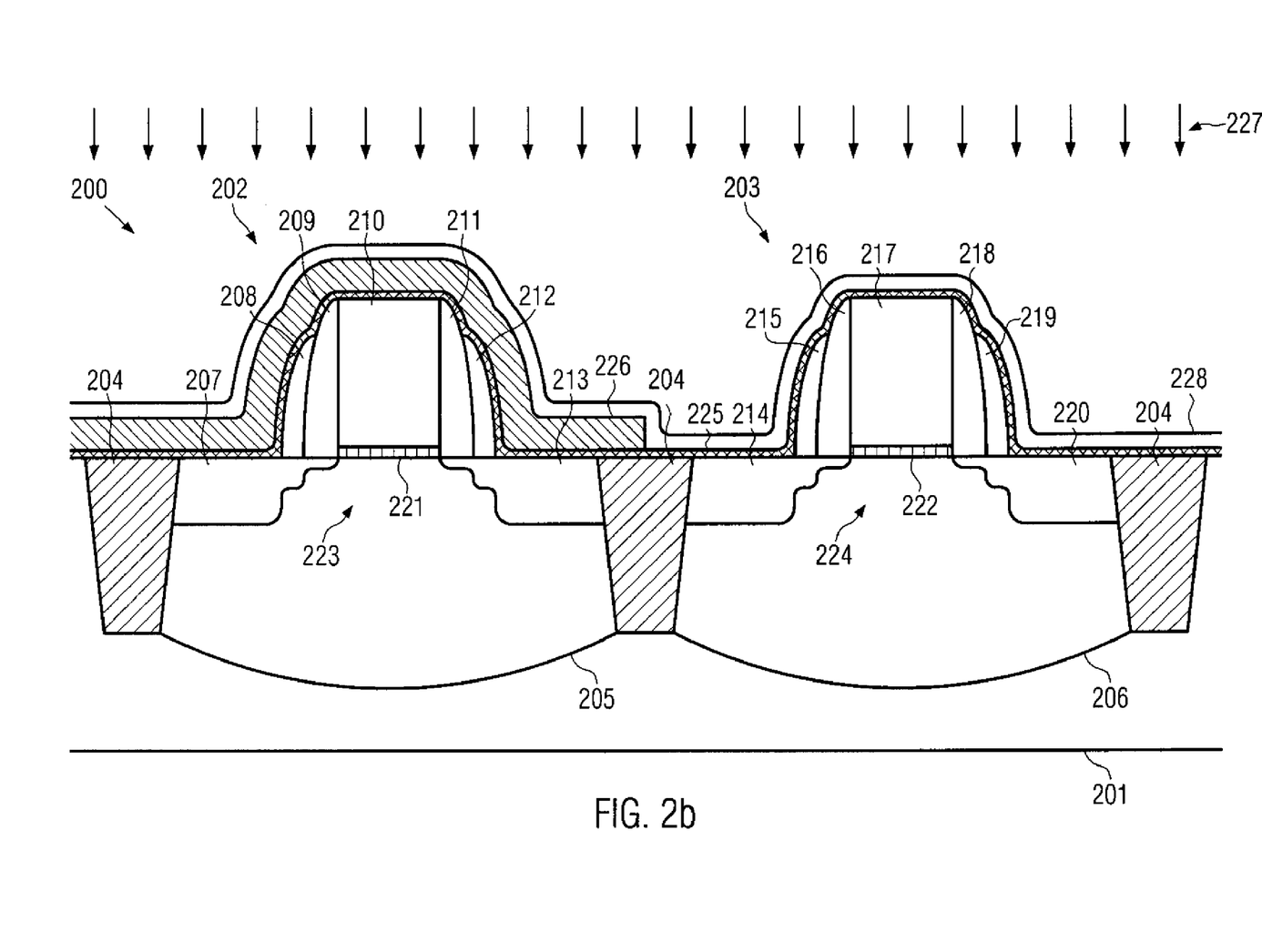

FIG. 2b shows a schematic cross-sectional view of the semiconductor structure 200 in a later stage of the manufacturing process. After the first annealing process, a second annealing process is performed. The stress-creating layer 226 may remain on the substrate 201 during the second annealing process. The second annealing process may comprise irradiating the semiconductor structure 200 with laser radiation, as indicated by arrows 227 in FIG. 2b.

In some embodiments, an absorption layer 228 may be formed over the semiconductor structure 200 before the second annealing process. A material of the absorption layer 228 and a wavelength of the laser radiation 227 are adapted such that the laser radiation 227 is strongly absorbed in the absorption layer 228. In some embodiments, the absorption layer 228 may comprise silicon. As persons skilled in the art know, silicon has a relatively high absorption coefficient for light having wavelengths in the ultraviolet range. In other embodiments, the absorption layer 228 may comprise carbon, for example in the form of diamond-like carbon having a relatively high absorption coefficient for light having wavelengths in the visual or ultraviolet range. Other materials may be employed as well.

The laser radiation 227 may be substantially absorbed in the absorption layer 228. Thus, the absorption layer 228 is heated to a relatively high temperature. The heat of the absorption layer 228 is then transmitted to the substrate 201, in particular to the source regions 207, 214 and the drain regions 213, 220, by heat conduction through the stress-creating layer 226 and the liner layer 225. Silicon nitride has a relatively high heat conductance. Hence, in embodiments wherein the stress-creating layer 226 comprises silicon nitride, heat generated in portions of the absorption layer 228 over the first transistor element 202 may be efficiently transferred to the source region 207 and the drain region 213. Hence, potential non-uniformities of the heating of the semiconductor structure 200 which might be caused by the presence of the stress-creating layer 226 may be substantially avoided or at least reduced.

In other embodiments, the absorption layer 228 may be omitted. In such embodiments, properties of the stress-creating layer 226 and the wavelength of the laser radiation 227 may be adapted such that a relatively large fraction of the laser radiation 227 is transmitted through the stress-creating layer 226. The transmission of the laser radiation 227 through the stress-creating layer 226 may be influenced both by an absorption of the laser radiation 227 in the stress-creating layer 226 and by a reflection of the laser radiation 227 by the stress-creating layer 226.

The absorption of the laser radiation 227 in the stress-creating layer 226 may be controlled by an adaptation of the wavelength of the laser radiation and the material composition of the stress-creating layer 226. For example, the stress-creating layer 226, when comprising silicon dioxide and/or silicon oxynitride, may have a low absorption coefficient for radiation in the visual and near ultraviolet wavelength range.

The reflection of light by the stress-creating layer 226 can be controlled by adapting a thickness of the stress-creating layer 226 such that a predetermined phase difference is introduced between laser radiation 227 reflected at a surface of the stress-creating layer 226 and laser radiation 227 reflected at an interface between the stress-creating layer 226 and the liner layer 225. Thus, an interference occurs between the laser radiation 227 reflected at the surface of the stress-creating layer 226 and the laser radiation 227 reflected at the interface between the stress-creating layer 226 and the liner layer 225. In some embodiments, the thickness of the stress-creating layer 226 can be adapted such that destructive interference is obtained. Thus, a reflection of the laser radiation 227 may be significantly reduced.

A reflection of the laser radiation may also occur at a portion of the liner layer 225 exposed over the second transistor element 203. In some embodiments, the thickness of the stress-creating layer 226 may be adapted such that a reflectivity of the stress-creating layer 226 formed over the first transistor element 202 is substantially equal to a reflectivity of the portion of the liner layer 225 formed over the second transistor element 203. Hence, an amount of energy introduced by the laser radiation 227 into the first transistor element 202 may be made substantially equal to an amount of energy introduced into the second transistor element 203.

An intensity of the laser radiation 227 provided in the second annealing process may be adapted such that portions of the substrate 201 at the surface thereof, in particular the source regions 207, 214 and the drain regions 213, 220, are heated to a predetermined temperature. In some embodiments, the second annealing process may be adapted such that a temperature sufficient for the activation of dopants in the source regions 207, 214 and in the drain regions 213, 220 is obtained. For example, the second annealing process can be adapted such that a temperature greater than about 800° C., in particular a temperature greater than about 1000° C., is obtained. A duration of the second annealing process may be adapted such that a diffusion of dopants in the source regions 207, 214 and the drain regions 213, 220 may be substantially avoided. For example, the duration may be less than approximately 1 ms.

In other embodiments, the second annealing process may comprise a rapid thermal annealing instead of the irradiation of the semiconductor structure 200 with the laser radiation 227 or in addition to the irradiation of the semiconductor structure 200 with the laser radiation 227.

Due to the presence of the stress-creating layer 226 on the first transistor element 202, a relaxation of the intrinsic stress created in the source region 207, the drain region 213 and the channel region 223 during the first annealing process may be substantially avoided. In some embodiments, the intrinsic stress in the source region 207, the drain region 213 and the channel region 223 may even be enhanced in the second annealing process, since the second annealing process may lead to a healing of lattice defects in the source region 207 and the drain region 213. Since the presence of lattice defects may lead to a reduction of the intrinsic stress, the healing of such lattice defects may increase the intrinsic stress.

After the second annealing process, the absorption layer 228, the stress-creating layer 226 and the liner layer 225 may be removed. To this end, etching processes well known to persons skilled in the art may be employed. For example, known wet etch processes may be used. The intrinsic stress created in the source region 207, the drain region 213 and the channel region 223 may be maintained at least partially after the removal of the stress-creating layer 226.

Thereafter, silicide regions which may, for example, comprise a cobalt silicide and/or a nickel silicide may be formed in the source regions 207, 214 and the drain regions 213, 220. As persons skilled in the art know, to this end, a refractory metal such as cobalt and/or nickel may be deposited over the semiconductor structure 200. Thereafter, a third annealing process may be performed in order to initiate a chemical reaction between the refractory metal and the silicon in the source regions 207, 214 and the drain regions 213, 220. The third annealing process may be performed at a temperature of less than about 800° C. This may help to avoid a relaxation of the intrinsic stress in the source region 207, the drain region 213 and the channel region 223 of the first transistor element 202 during the third annealing process.

The subject matter disclosed herein is not restricted to embodiments wherein a first and a second annealing process are performed. In other embodiments, the first annealing process may be omitted. In such embodiments, a single annealing process which comprises irradiating the semiconductor structure 200 with laser radiation, similar to the second annealing process described above with reference to FIG. 2b, may be performed. This annealing process may be adapted to both induce a re-crystallization of the material in the amorphous regions 230, 231 and to activate dopants in the source regions 207, 214 and in the drain regions 213, 220.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:

providing a semiconductor substrate comprising a first transistor element and a second transistor element;

implanting said semiconductor substrate with ions of a non-doping element to form at least one first amorphous region in said first transistor element and at least one second amorphous region in said second transistor element;

forming a stress-creating layer over said first transistor element, wherein said stress-creating layer does not cover said second transistor element;

performing a first annealing process using at least one of a rapid annealing process or a furnace annealing process, said first annealing process being adapted to induce solid phase epitaxial regrowth to re-crystallize said first amorphous region and said second amorphous region; and after performing said first annealing process, performing a second annealing process by irradiating said semiconductor structure with laser radiation to activate dopants in said first and second transistor elements, wherein said stress-creating layer remains over said first transistor element during said second annealing process.

2. The method of claim 1, wherein said stress-creating layer comprises silicon nitride.

3. The method of claim 1, wherein said stress-creating layer comprises an intrinsic stress.

4. The method of claim 3, further comprising removing said stress-creating layer.

5. The method of claim 1, further comprising forming a liner layer over said first transistor element and said second transistor element prior to forming said stress-creating layer.

6. The method of claim 5, wherein said liner layer comprises silicon dioxide.

7. The method of claim 1, wherein said first annealing process is performed at a temperature of about 800° C. or less.

8. The method of claim 1, wherein providing said semiconductor substrate comprises performing an ion implantation process to introduce a dopant material into at least one of said first transistor element and said second transistor element and wherein said second annealing process is adapted to activate said dopant material.

9. The method of claim 1, further comprising depositing an absorption layer adapted to absorb said laser radiation over said stress-creating layer and said second transistor element.

* * * * *